United States Patent [19]

Kobayashi et al.

[11] 4,402,994
[45] Sep. 6, 1983

[54] HIGHLY HARD MATERIAL COATED ARTICLES

[75] Inventors: Mitsunori Kobayashi; Yoshihiko Doi, both of Itami, Japan

[73] Assignee: Sumitomo Electric Industries, Ltd., Osaka, Japan

[21] Appl. No.: 410,919

[22] Filed: Aug. 24, 1982

Related U.S. Application Data

[62] Division of Ser. No. 258,550, Apr. 29, 1981.

[30] Foreign Application Priority Data

May 2, 1980 [JP] Japan ................... 55/57770

[51] Int. Cl.³ .................. B05D 1/00; B32B 15/04; C23C 15/00
[52] U.S. Cl. ........................... 427/38; 427/39
[58] Field of Search ................... 427/38, 39

[56] References Cited

U.S. PATENT DOCUMENTS 4,169,913 10/1979 Kobayashi et al. ............. 428/217

Primary Examiner—James R. Hoffman
Attorney, Agent, or Firm—Wenderoth, Lind & Ponack

[57] ABSTRACT

This invention relates to a highly hard material coated article which comprises a substrate of tool or part consisting of cermets, cemented carbides, tool steels or stainless steels and at least one highly hard material coated on the surface thereof, selected from the group consisting of carbides, nitrides and carbonitrides of at least one of titanium, zirconium and hafnium and those in which oxygen is dissolved, the coating being formed by an ion plating method wherein the accelerating voltage is high in a short time at the initial stage only, the crystals of the coated film being strongly orientated in the direction of <220> for the surface of the tool or part so that the diffraction intensity ratio of the peak from the {220} plane and the secondly strong diffraction peak in the X-ray diffraction using Cu-Kα ray, that is, the diffraction intensity ratio is 15 or less of the latter to 100 of the former and the half value width of the diffraction peak from the {220} plane of the coating film being 0.8° or more on 2θ scale.

1 Claim, 1 Drawing Figure

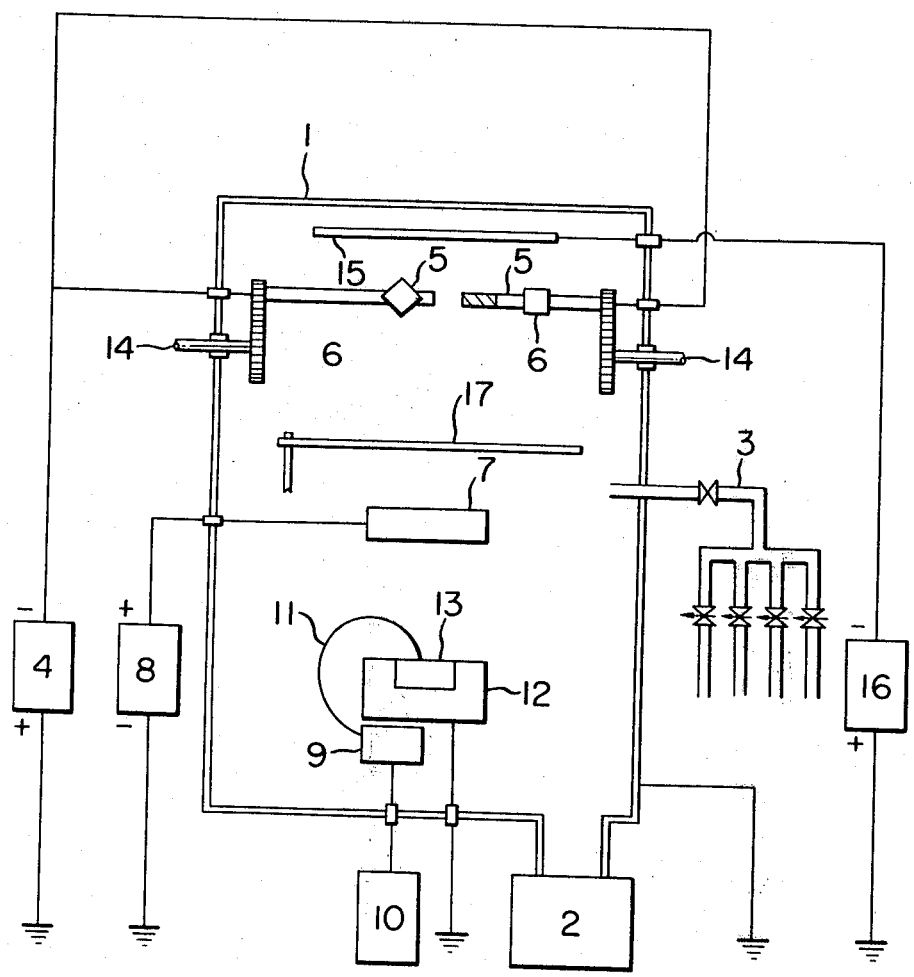

HIGHLY HARD MATERIAL COATED ARTICLES

This is a Divisional Application of Ser. No. 258,550, filed Apr. 29, 1981.

BACKGROUND OF THE INVENTION

1. Field of the Invention

This inventions relates to novel highly hard material coated articles and more particularly, it is concerned with highly hard articles, for example, cutting tools such as turning tools and cutters, wear resisting tools such as metallic molds and wire drawing dies, wear parts such as bearings and cams, and decorations such as watch frames, coated for the purpose of raising the wear resistance, heat resistance and corrosion resistance with high hardness, high melting point and high chemical stability compounds such as carbides, nitrides, or carbonitrides of titanium, zirconium, hafnium or their alloys, or those in which oxygen is dissolved, with a thickness of 1 to 20 microns.

2. Description of the Prior Art

It is well known to coat a tool or part with titanium carbide or titanium nitride in order to improve the wear resistance, heat resistance and corrosion resistance thereof and this is put to practical use. For the fabrication of the coated article, the chemical vapor deposition method (CVD method) or dipping-in-fused salt method represented by "TD process" is used, but these methods are all coating methods carried out at high temperatures such as about 1000° C., so thermal deformations or structure changes tend to occur in the substrates of tools or parts although the adhesion strength between the coating film and substrate is considerably large due to diffusion. Thus, their use is considerably limited. For example, if the substrate is of a tool steel, it is annealed and if stainless steel, the corrosion resistance is deteriorated. The substrate of a cemented carbide alloy tends to be brittle.

On the other hand, progress of the physical vapor deposition method (PVD method) is remarkable and titanium carbide or titanium nitride can be coated even at low temperatures such as below 500° C. The so-called physical vapor deposition method includes the vapor deposition method, sputtering method, activated reactive vapor deposition method (ARE method), hollow cathode discharge vapor deposition method (HCD method), ion plating method and the like, but above all, the ion plating method wherein a material to be vapor deposited is much energized as positive ion by applying a negative accelerating voltage to a substrate is most preferable for increasing the adhesion strength between the coating film and substrate. This ion plating method can be classified into two kinds of the high pressure type (low vacuum type) in which ionization is carried out by glow discharge in an ambient gas under a pressure of 0.5 to 3 Pa, and the low pressure type (high vacuum type) in which ionization is carried out by an intermediate electrode, electron irradiation or high frequency electric field under a pressure of 0.1 Pa or less. However, the ion plating method of the high pressure type has the disadvantage that because of its high ambient pressure, the coating film of titanium carbide or titanium nitride tends to be weak and no sufficient adhesion strength is obtained since the acceleration of ions is carried out mainly at the cathode dark portion about the base material. In the case of the low pressure type, on the other hand, a coating film of good quality can readily be obtained and it is possible to accelerate sufficiently ions with a substantially uniform potential gradient, resulting in a high adhesion strength, but the film quality and adhesion strength are largely affected by the ionization efficiency and accelerating voltage. The ordinary ion plating method is not so effective for increasing the adhesion strength because the ionization efficiency is generally low and the energy given to a material to be vapor deposited cannot be increased so much even if the accelerating voltage is increased. Consequently, there have been proposed the HCD method and ARE method whereby the adhesion strength is increased by heating a substrate without applying an accelerating voltage, but the adhesion strength is not sufficient at low temperatures and the advantages of the physical vapor deposition method as described above are lost at high temperatures. When applying an accelerating voltage using the ordinary ion plating apparatus with a low ionization efficiency, for example, the current flowing through an accelerating electrode (in general, substrate) is very small, i.e. about 0.01 to 0.2 A even if the accelerating voltage is considerably high.

The inventors have hitherto employed such an ion plating process in a study on the coating of cemented carbide inserts with a layer of TiN or TiC for comparison with the chemical vapor deposition process, as disclosed in "Thin Solid Films" 54 (1978) p 67–74. According to this study, it is apparent that the wear resistance of carbides coated by ion plating is similar to that of carbides coated by chemical vapor deposition, but the toughness obtained by ion plating is superior to that of chemically vapor deposited coatings. In addition, the inventors have also proposed a coated tool steel comprising a tool steel substrate and a coated film thereon consisting of at least one of titanium, zirconium and hafnium carbides, nitrides and carbonitrides, which has a greater half value width, as disclosed in U.S. Pat. No. 4,169,913. However, these coated articles are not satisfactory in adhesion strength between the substrate and coating.

SUMMARY OF THE INVENTION

It is an object of the present invention to provide a highly hard material coated article excellent in wear resistance, heat resistance and corrosion resistance.

It is another object of the present invention to provide cutting tools, wear resisting tools, wear parts and decoration articles with an improved wear resistance, heat resistance and corrosion resistance.

It is a further object of the present invention to provide a coated article with an improved adhesion strength between the substrate and coating by ion plating method.

These objects can be attained by a highly hard material coated article which comprises a substrate of tool or part consisting of cermets, cemented carbides, tool steels or stainless steels and at least one highly hard material coated on the surface thereof, selected from the group consisting of carbides, nitrides and carbonitrides of at least one of titanium, zirconium and hafnium and solid solutions thereof and those in which oxygen is dissolved, the coating being formed by an ion plating method wherein the accelerating voltage is high in a short time at the initial stage only, the crystals of the coated film being strongly orientated in the direction of <220> for the surface of the tool or part so that the diffraction intensity ratio of the peak from the {220} plane and the secondly strong diffraction peak in the X-ray diffraction using Cu-Kα ray, that is, the diffraction intensity ratio is 15 or less of the latter to 100 of the former, and the half value width of the diffraction peak from the {220} plane of the coating film being 0.8° or more on 2 θ scale.

BRIEF DESCRIPTION OF THE DRAWING

The accompanying drawing FIGURE is a schematic view of an ion plating system used in the present invention.

DETAILED DESCRIPTION OF THE INVENTION

The inventors have made various efforts to overcome the disadvantages of the prior art, in particular, to improve the ion plating method and apparatus therefor and consequently, have found that a highly hard material coated article excellent in adhesion strength between the substrate and coating can be obtained under the specified conditions in the ion plating method.

In the high hard material coated article according to the present invention, the surface of a tool or part is coated with at least one high hard material selected from carbides, nitrides and carbonitrides of titanium, zirconium, hafnium and solid solutions thereof and those compounds in which oxygen is dissolved, and the crystals of the coated film are strongly orientated in the direction of <220> for the surface of the tool or part so that the diffraction intensity ratio of the peak from the {220} plane and the secondly strong diffraction peak in the X-ray diffraction using Cu-Kα ray, that is, the diffraction intensity ratio is 15 or less of the latter to 100 of the former.

In an ion plating apparatus used in the present invention, the ionization efficiency is high and the electric current passing through an accelerating electrode is extraordinarily great, i.e. at least 1 to 20 A even if the accelerating voltage is low. Because of such a high ionization efficiency, the energy of the individual ion of a material to be vapor deposited can be increased by raising the accelerating voltage, thus resulting in a coating film with a high adhesion strength. The crystals of the coating film obtained in this way are strongly orientated in the direction of <220> for the surface of the substrate. According to the results of our studies, it is found that the adhesion strength is sufficiently great on practical use when the diffraction intensity ratio of the diffraction peak from the {220} plane and the secondly strong diffraction peak in the X-ray diffraction using Cu-Kα ray, that is, the diffraction intensity ratio is at most 15 of the latter to 100 of the former. In this range, for example, the coated tool can be used in interrupted turning operations. When this ratio is less than 10, the coated tool has a high adhesion strength and has a good performance in milling operation in which the prior art coated tool cannot favourably be used.

In the present invention, however, the electric current passing through a substrate is great, i.e. 1 to 20 A, so if the accelerating voltage is for example 1.5 KV, the electric power applied to the substrate is 1.5 to 30 KW and the temperature of the substrate is markedly increased. Thus, there is a possibility of deteriorating the feature of the physical vapor deposition method that coating can be accomplished at a low temperature.

Furthermore, it is also found by out studies that when coating is carried out using an ion plating apparatus with a high ionization efficiency, the crystalline disorder of the coating film is increased with lowering of the temperature and the half value width of the diffraction peak in the X-ray diffraction is great. Herein, it is to be noted that the greater the half value width, the more improved the wear resistance of the coating film. For example, when the half value width of the diffraction peak from the {220} plane of the coating film in X-ray diffraction using Cu-Kα ray is at least 0.8° on 2 θ scale, there is given a very excellent wear resistance, and when at least 1°, the wear resistance is more improved.

That is to say, if in the X-ray diffraction using Cu-Kα ray, the diffraction intensity ratio of the peak from the {220} plane and the secondly strong diffraction peak is at most 15 of the latter to 100 of the former, and the half value width of the diffraction peak from the {220} plane is at least 0.8° on 2 θ scale, there can be obtained a coated article having an excellent adhesion strength of the coating as well as a high wear resistance.

However, in order to lower the diffraction intensity ratio to 15 or less, it is necessary to raise the accelerating voltage applied to a substrate while in order to increase the half value width, it is necessary to lower the accelerating voltage.

The inventors have made efforts to solve this contradictory problem and consequently, it is found that the diffraction intensity ratio is determined by the voltage at the initial period of coating and the half value width depends upon the electric power. Based on this finding, the accelerating voltage at the initial period of coating is increased and then the accelerating voltage is lowered, thereby obtaining a coated article with a diffraction intensity ratio of 15 or less and a half value width of 0.8° or more. In general, if the thickness of a coating film is less than 1 micron, the effect thereof is too small, while if more than 20 microns, peeling-off and embrittlement of the coating film often take place.

When the accelerating voltage is changed as described above, the diffraction intensity ratio and half value width are correspondingly changed, but the quantity or degree of changes depends upon the variety, shape and dimension of a substrate, the interior dimension or mechanism of an ion plating apparatus and the ionization efficiency. In addition, it differs depending on materials to be vapor deposited, for example, whether it is titanium carbide or titanium nitride, and accordingly, it is difficult to determine unconditionally the diffraction intensity ratio and half value width correspondingly to the accelerating voltage. In the case of coating titanium nitride by the use of titanium as a material to be vapor deposited and nitrogen as a reactive gas, however, the prior art method is carried out by applying an accelerating voltage of 0 to 2 KV throughout the coating and heating a substrate at a temperature of 500° to 700° C. to give a diffraction intensity ratio (I/Imax) magnified 100 times of 25 to 80 and half value width (2 θ) of 0.1° to 0.5°, while in the present invention, the accelerating voltage is preferably adjusted to 0.5 to 5 KV at the initial stage and lowered to 0.1 to 0.5 KV after the passage of about 5 to 10 minutes to give a diffraction intensity ratio of less than 15 and half value width of more than 0.8°.

In an example according to the present invention, an end mill (10 mmφ) of high-speed steel (JIS SKH 55 equivalent to AISI M35) is coated with TiN with a thickness of 2.3 μm by holding an accelerating voltage of 0.5 KV at the initial period and lowering to 0.2 KV after the passage of 5 minutes, the coating being carried out over 25 minutes. The results of X-ray diffraction show that the diffraction intensity ratio of the peak from the {220} plane and the secondly strong peak from the {111} plane is 13 of the latter to 100 of the former.

In another example, a throw-away insert (Insert type: SNG 533) of cermet of TiCN-TaN-Mo$_2$C-WC-Ni-Co type is coated with TiN with a thickness of 9 μm by holding an accelerating voltage of 5 KV at the initial period and lowering to 0.5 KV after the passage of 5 minutes, the coating being carried out over 110 minutes. The results of X-ray diffraction show that the diffraction intensity ratio of the highest peak from the {220} plane and the secondly strong diffraction peak from the {220} plane is 1.3 of the latter to 100 of the former.

The coating film in the highly hard material coated article of the present invention can be of a multi-film or combined with a film of alumina or silicon nitride.

One embodiment of coating by means of an ion plating apparatus used in the present invention will now be illustrated by the accompanying drawings:

Substrate 5 is fitted to substrate holder 6 and vacuum chamber 1 is evacuated to a pressure of $8 \times 10^{-3}$ Pa or less by means of evacuating device 2. Argon gas is introduced into vacuum chamber 1 to a pressure of about 3 Pa from gas feed system 3. A negative voltage of about 1.5 KV is applied to substrate 5 by substrate accelerating power supply 4 to produce glow discharge and to heat substrate 5, and the surface of substrate 5 is thus cleaned. Feeding of the argon gas is stopped and vacuum chamber 1 is evacuated again.

Metal 13 of titanium, zirconium, hafnium or an alloy consisting of two or more of these metals in water-cooled copper crucible 12 is irradiated with electron beam 11 emitted from electron gun 9 by operating power source 10 for electron gun 9, melted and vaporized. A positive voltage of 20 to 100 V is applied to ionization electrode 7 by ionization powersource 8 and between ionization electrode 7 and molten metal 13 is produced a discharge by secondary electrons emitted by bonbardment of electron beam 11 and molten metal 13 and the metallic vapor vaporized from the surface of molten metal 13. At least one gas selected from the group consisting of nitrogen gas, acetylene gas and oxygen gas and mixtures thereof is introduced as a reactive gas into vacuum chamber 1 from gas feed system 3 so as to give a pressure of $2.5 \times 10^{-2}$ to $9.5 \times 10^{-2}$ Pa. Substrate 5 is revolved by revolving mechanism 14, to which a negative voltage of 0.5 to 5 KV is applied by substrate accelerating power source 4. In this case, an accelerating voltage can be applied to accelerating electrode 15 by accelerating power source 16 despite application of a voltage to substrate 5. Shutter 17 is opened and coating of substrate 5 is then started. After the passage of 5 to 10 minutes, the accelerating voltage is lowered to a negative voltage of 0.1 to 0.5 KV. If substrate 5 is on the earth or the lower potential and is accelerated by accelerating electrode 15, the substrate is not overheated and thus it is not necessary to lower the accelerating voltage. In this way, a highly hard material coated article of the present invention is obtained.

The following examples are given in order to illustrate the present invention in detail without limiting the same.

EXAMPLES

Using the above described ion plating apparatus, a substrate (Insert type: SPG 422) consisting of cemented carbide alloy P 30 was coated under various conditions as shown in the following table and subjected to assessment (Table 1 and Table 2):

TABLE 1

|  |  |  |  | Initial Conditions | | | Stationary Conditions | | |
|---|---|---|---|---|---|---|---|---|---|
| No. | Evaporation Material | Ambient pressure ($\times 10^{-2}$ pa) | Ambient Gas | Power Source 4 (KV) | Power Source 16 (KV) | Time (min) | Power Source 4 (KV) | Power Source 16 (KV) | Time (min) |
| 1 |  | Non-coated Article | — | — | — | — | — | — | — |
| 2 | Ti | 4 | N$_2$ + C$_2$H$_2$ | 0.1 | 1.5 | 5 | 0.1 | 1.5 | 50 |
| 3 | Ti | 4 | N$_2$ + C$_2$H$_2$ | 1.5 | 0 | 5 | 0.3 | 0 | 50 |
| 4 |  | By Prior Art PVD Process | | | | | | | |
| 5 |  | By Prior Art CVD Process | | | | | | | |
| 6 | Ti | 4.5 | N$_2$ | 0.1 | 2.0 | 8 | 0.1 | 2.0 | 50 |
| 7 | Ti | 4.5 | N$_2$ | 2.0 | 0 | 8 | 0.5 | 0 | 50 |
| 8 |  | By Prior Art PVD Process | | | | | | | |
| 9 | Ti | 4 | N$_2$ + C$_2$H$_2$ + O$_2$ | 0.1 | 1.8 | 5 | 0.1 | 1.8 | 50 |
| 10 | Ti | 4 | N$_2$ + C$_2$H$_2$ + O$_2$ | 2.0 | 0 | 5 | 0.5 | 0 | 50 |
| 11 |  | By Prior Art PVD Process | | | | | | | |
| 12 | Zr | 3 | C$_2$H$_2$ | 0.1 | 3.0 | 10 | 0.1 | 3.0 | 150 |
| 13 | Zr | 3 | C$_2$H$_2$ | 1.8 | 0 | 10 | 0.6 | 0 | |
| 14 |  | By Prior Art PVD Process | | | | | | | |
| 15 | Hf | 2.8 | N$_2$ | 0.1 | 3.5 | 10 | 0.1 | 3.5 | 200 |
| 16 | Hf | 2.8 | N$_2$ | 3.0 | 0 | 10 | 0.6 | 0 | |
| 17 |  | By Prior Art PVD process | | | | | | | |

| Film Quality | Film Thickness (μm) | Strongest Diffraction Plane (Intensity Imax) | Secondly Strong Diffraction Plane (Intensity I) | Intensity Ratio (I/Imax) × 100 | (220) Plane Diffraction Peak Half Value Width (2 θ) | Broken State After Cutting Test (Flank Wear Width) |
|---|---|---|---|---|---|---|
| — | — | — | — | — | — | after 20 min 0.29 mm |
| Ti(CN) | 4.5 | {220} | {200} | 5.7 | 1.6° | after 20 min 0.10 mm |
| Ti(CN) | 4.6 | {220} | {111} | 8.3 | 1.2° | after 20 min 0.14 mm |
| Ti(CN) | 4.5 | {220} | {111} | 71.3 | 0.3° | after 10 min peeling |
| Ti(CN) | 4.5 | {220} | {111} | 29.7 | 0.3° | after 1 min broken |
| TiN | 4.6 | {220} | {111} | 4.1 | 1.9° | after 20 min 0.12 mm |
| TiN | 4.8 | {220} | {111} | 7.7 | 1.1° | after 20 min 0.15 mm |
| TiN | 4.5 | {200} | {111} | 68.1 | 0.2° | after 7 min peeling |
| Ti(CNO) | 4.5 | {220} | {200} | 5.3 | 1.8° | after 20 min 0.12 mm |
| Ti(CNO) | 4.5 | {220} | {200} | 7.9 | 1.1° | after 20 min 0.14 mm |
| Ti(CNO) | 4.2 | {200} | {111} | 59.9 | 0.3° | after 7 min peeling |
| ZrC | 3.9 | {220} | {200} | 3.5 | 2.0° | after 20 min 0.09 mm |

TABLE 1-continued

| | | | | | | |
|---|---|---|---|---|---|---|
| ZrC | 4.1 | {220} | {111} | 8.0 | 1.5° | after 20 min 0.12 mm |
| ZrC | 4.3 | {200} | {111} | 67.5 | 0.3° | after 3 min peeling |
| HfN | 2.2 | {220} | {200} | 3.1 | 2.1° | after 20 min 0.13 mm |
| HfN | 2.4 | {220} | {111} | 7.2 | 1.7° | after 20 min 0.16 mm |
| HfN | 2.0 | {200} | {111} | 73.3 | 0.3° | after 4 min peeling |

TABLE 2

| Property Assessment Condition | |
|---|---|
| Item | Contents |
| Cutting Method | Face milling |
| Workpiece | |
| Material | SCM 3 (JIS) |
| Hardness | Hs 32 |
| Dimension | width 100 mm: length 300 mm |
| Tool (Cutter) | Milling cutter with one insert (cutter diameter 160 mm) |
| Cutting Conditions | |
| Speed | 180 m/min |
| Cut | 3 mm |
| Feed | 0.2 mm/rev |

The test results of the resulting samples show that the coated articles of the present invention have much more excellent properties or performances than the prior art coated articles and in comparison with the non-coated article, wear resistance is 1.8 to 3.2 times more excellent. When the coated articles of the present invention are compared with each other, samples whose X-ray diffraction intensity ratio (I/Imax)×100 is small and half value width of {200} plane diffraction peak is large have better performances.

EXAMPLE 2

Using the ion plating apparatus of Example 1, titanium was heated and evaporated by an electron beam, ionized at an ionizing potential of +40 V and deposited on a hob with module 1 and 20° in pressure angle (JIS SKH 57) at a substrate potential of −0.8 KV for 5 minutes and −0.5 KV for 25 minutes in a mixed gas under a total pressure of $5 \times 10^{-4}$ Torr, in which the partial pressure of acetylene was $2 \times 10^{-4}$ Torr and the partial pressure of nitrogen was $3 \times 10^{-4}$ Torr, thus obtaining a coated product with an intensity ratio [($I_{200}/I_{220}) \times 100$] of 9.7 and a half value width of 1.0° on 2 $\theta$ scale. The thus treated hob was subjected to gear cutting of JIS S50C workpiece at a cutting speed of 106 m/min and 1061 rpm in the presence of cutting oil. 230 pieces could be machined. On the other hand, when a conventional tool cut only 100 pieces, the tool life expired.

In cutting tools, wear resisting tools, wear parts or decoration articles coated with highly hard materials according to the present invention, a material for a part requiring at least a wear resistance, heat resistance and corrosion resistance is generally chosen from cermets, cemented carbides, tool steels and stainless steels. For example, a throw-away insert of a cermet or cemented carbides coated with a highly hard material according to the present invention exhibits excellent performances, in particular, for milling operations.

What is claimed is:

1. A process for the production of a highly hard material coated article, which comprises coating a substrate of tool or part consisting of cermet, cemented carbide tool steel or stainless steel. with at least one highly hard material selected from the group consisting of carbides, nitrides and carbonitrides of at least one of titanium, zirconium and hafnium and solid solutions thereof and those in which oxygen is dissolved with a thickness of 1 to 20 microns by an ion plating method comprising applying an accelerating voltage of 0.5 to 5 KV to the substrate at the initial period, followed by lowering the accelerating voltage to 0.1 to 0.5 KV after the passage of about 5 to 10 minutes, in a reactive gas.

* * * * *